United States Patent
Kobayashi et al.

(10) Patent No.: US 7,608,498 B2
(45) Date of Patent: Oct. 27, 2009

(54) METHOD OF MANUFACTURING SEMICONDUCTOR DEVICE

(75) Inventors: Takuya Kobayashi, Yokohama-Shi (JP);
Katsuyuki Sekine, Yokohama (JP);
Tomonori Aoyama, Yokohama (JP);
Hiroshi Tomita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/003,802

(22) Filed: Jan. 2, 2008

(65) Prior Publication Data
US 2008/0182396 A1 Jul. 31, 2008

Related U.S. Application Data

(63) Continuation of application No. 11/494,736, filed on Jul. 28, 2006, now Pat. No. 7,335,562.

(30) Foreign Application Priority Data

Oct. 24, 2005 (JP) .............................. 2005-308564
Feb. 28, 2006 (JP) .............................. 2006-052166

(51) Int. Cl.
*H01L 21/336* (2006.01)
(52) U.S. Cl. .................. 438/197; 438/287; 438/585; 438/183; 257/E21.625
(58) Field of Classification Search ................ 438/197, 438/183, 287, 585
See application file for complete search history.

(56) References Cited

U.S. PATENT DOCUMENTS

| | | | |
|---|---|---|---|
| 6,531,324 B2 | 3/2003 | Hsu et al. | |
| 6,602,720 B2 | 8/2003 | Hsu et al. | |
| 6,727,129 B1 | 4/2004 | Nakajima | |
| 6,784,507 B2 | 8/2004 | Wallace et al. | |
| 7,064,066 B1 | 6/2006 | Metz et al. | |
| 2003/0062586 A1* | 4/2003 | Wallace et al. | 257/506 |
| 2004/0004234 A1 | 1/2004 | Yagashita et al. | |

FOREIGN PATENT DOCUMENTS

| | | |
|---|---|---|
| JP | 2000-243953 | 9/2000 |
| JP | 2001-085683 | 3/2001 |

OTHER PUBLICATIONS

Watanabe et al., "Impact of Hf Concentration on Performance and Reliability for HfSiON-CMOSFET," IEDM Tech. Dig. (Dec. 2004), pp. 507-510.

\* cited by examiner

*Primary Examiner*—Jack Chen
(74) *Attorney, Agent, or Firm*—Finnegan, Henderson, Farabow, Garrett & Dunner, L.L.P.

(57) ABSTRACT

A method of manufacturing a semiconductor device includes forming a trench in an interlayer dielectric film on the semiconductor substrate, the trench reaching a semiconductor substrate and having a sidewall made of silicon nitride film; depositing a gate insulation film made of a HfSiO film at a temperature within a range of 200 degrees centigrade to 260 degrees centigrade, so that the HfSiO film is deposited on the semiconductor substrate which is exposed at a bottom surface of the trench without depositing the HfSiO film on the silicon nitride film; and filling the trench with a gate electrode made of metal.

8 Claims, 16 Drawing Sheets

DEPOSITION TEMPERATURE: 230°C,
DEPOSITION: 3 MINUTES

| | Hf intensity | HfSiO thickness | intensity/ thickness |
|---|---|---|---|
| HfSiO ON SiO₂(3nm) | S1=1455.95 | 9.20(nm) | 158.2 |
| HfSiO ON SILICON SUBSTRATE | S2=704.20 | 5.87 (nm) | 120.0 |

FIG. 22

METHOD OF MANUFACTURING SEMICONDUCTOR DEVICE

CROSS-REFERENCE TO RELATED APPLICATIONS

This is a division of application Ser. No. 11/494,736, filed Jul. 28, 2006 now U.S. Pat. No. 7,335,562, which is incorporated herein by reference.

This application is based upon and claims the benefit of priority from the prior Japanese Patent Applications No. 2005-308564, filed on Oct. 24, 2005 and No. 2006-52166, filed on Feb. 28, 2006, the entire contents of which are incorporated herein by reference.

BACKGROUND OF THE INVENTION

1. Field of the Invention

The present invention relates to a method of manufacturing a semiconductor device.

2. Related Art

In order to microfabricate a semiconductor device, there has been developed a technique using a high dielectric film, such as HfSiON, as a gate dielectric film and using metal as a gate electrode on the gate dielectric film.

A gate electrode made of metal is difficult to be processed, unlike a gate electrode made of polysilicon, and has poor thermal stability. In order to solve these problems, a method of forming a gate electrode using a damascene process has been proposed. According to this process, a dummy gate is formed first, and an extension layer is formed using this dummy gate electrode as a mask. Thereafter, this dummy gate electrode is removed to form a trench. A gate dielectric film and a metal gate electrode are embedded into this trench.

However, at the time of depositing the gate dielectric film in the trench, a high dielectric material that becomes the gate dielectric film is deposited on the side surface of the trench as well as the bottom surface of the trench. When a gate dielectric film is formed on the side surface of the trench, a length or a width of the gate electrode becomes small. As a result, a distance between a source/drain diffusion layer (an extension layer) and the gate electrode becomes long. Consequently, an on-current decreases. Furthermore, because a distribution of an electric flux line changes at the end of the gate electrode, a MOSFET does not operate easily due to a short-channel effect.

A MISFET (metal insulator semiconductor field effect transistor) requires various leak characteristics, various threshold voltages, and various operation powers, depending on specifications. In order to form a MISFET having various characteristics on the same semiconductor substrate, it is necessary to form gate dielectric films having different film thickness of gate dielectric films and different concentrations of high-dielectric materials (such as hafnium) in the gate dielectric films.

According to a conventional method of manufacturing a semiconductor device, it has been necessary to repeat processes such as film forming, patterning, and etching many times in order to form gate dielectric films having various film thicknesses and various concentrations of high-dielectric materials. Because the number of processes of manufacturing a semiconductor device increases, the cost of the semiconductor device increases, and it becomes difficult to maintain stable characteristics of the semiconductor device.

SUMMARY OF THE INVENTION

A method of manufacturing a semiconductor device according to an embodiment of the present invention comprises forming a trench in an interlayer dielectric film on the semiconductor substrate, the trench reaching a semiconductor substrate and having a sidewall made of silicon nitride film; depositing a gate dielectric film made of a HfSiO film at a temperature within a range of 200 degrees centigrade to 260 degrees centigrade, so that the HfSiO film is deposited on the semiconductor substrate which is exposed at a bottom surface of the trench without depositing the HfSiO film on the silicon nitride film; and filling the trench with a gate electrode made of metal.

A method of manufacturing a semiconductor device according to an embodiment of the present invention comprises forming a trench in an interlayer dielectric film on the semiconductor substrate, the trench reaching a semiconductor substrate and having a sidewall made of silicon nitride film; forming a silicon oxide film as a part of a gate insulation film on the semiconductor substrate which is exposed at a bottom surface of the trench; depositing a gate dielectric film made of a HfSiO film as another part of a gate dielectric film at a temperature within a range of 200 degrees centigrade to 260 degrees centigrade, so that the HfSiO film is deposited on the silicon dioxide film which is exposed at a bottom surface of the trench without depositing the HfSiO film on the silicon nitride film; and filling the trench with a gate electrode made of metal.

A method of manufacturing a semiconductor device according to an embodiment of the present invention comprises preparing a semiconductor substrate which has a main surface including a first region in which a semiconductor oxide film, a semiconductor nitride film, or a semiconductor oxynitride film are provided, and a second region in which the semiconductor material is exposed; and depositing HfSiO film at a temperature within a range of 200 degrees centigrade to 260 degrees centigrade to form HfSiO films having different hafnium concentrations in the first region and in the second region.

BRIEF DESCRIPTION OF THE DRAWINGS

FIG. 22 is a table showing one example of a process of forming a HfSiO film according to the third embodiment.

DETAILED DESCRIPTION OF THE INVENTION

Hereafter, embodiments the present invention will be explained with reference to the drawings. Note that the invention is not limited by the embodiments.

First Embodiment

FIGS. 1 to 6 are cross-sectional views of a semiconductor device showing a method of manufacturing the semiconductor device according to a first embodiment of the present invention.

A silicon substrate 10 is prepared as a semiconductor substrate. An STI (shallow trench isolation) 20 is formed on the silicon substrate 10, using a known method. For example, a buffer film not shown is formed on the silicon substrate 10, and a silicon nitride film not shown for a mask is deposited on the buffer film. The silicon nitride film, the buffer film, and the silicon substrate 10 in an element isolation region are then etched, using a lithographic technique and RIE (reactive ion etching), thereby forming a trench not shown. After silicon dioxide is deposited to form a silicon dioxide film in the trench, this silicon dioxide film is planarized by using CMP (chemical mechanical polishing) or the like. Furthermore, the silicon dioxide film, the silicon nitride film, and the buffer film are removed, thereby forming the STI 20.

Figure 1:
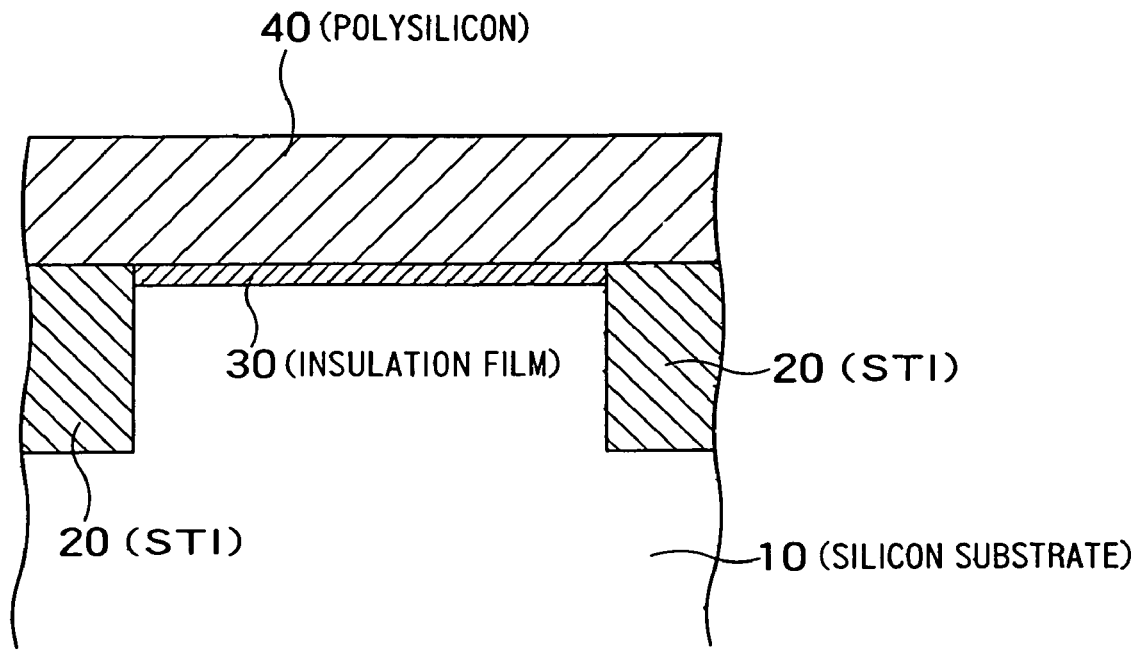
FIGS. 1 to 6 are cross-sectional views of a semiconductor device showing a method of manufacturing the semiconductor device according to a first embodiment.

As shown in FIG. 1, a dielectric film 30 and polysilicon 40 are deposited in an element formation region between the STIs 20.

Figure 2:
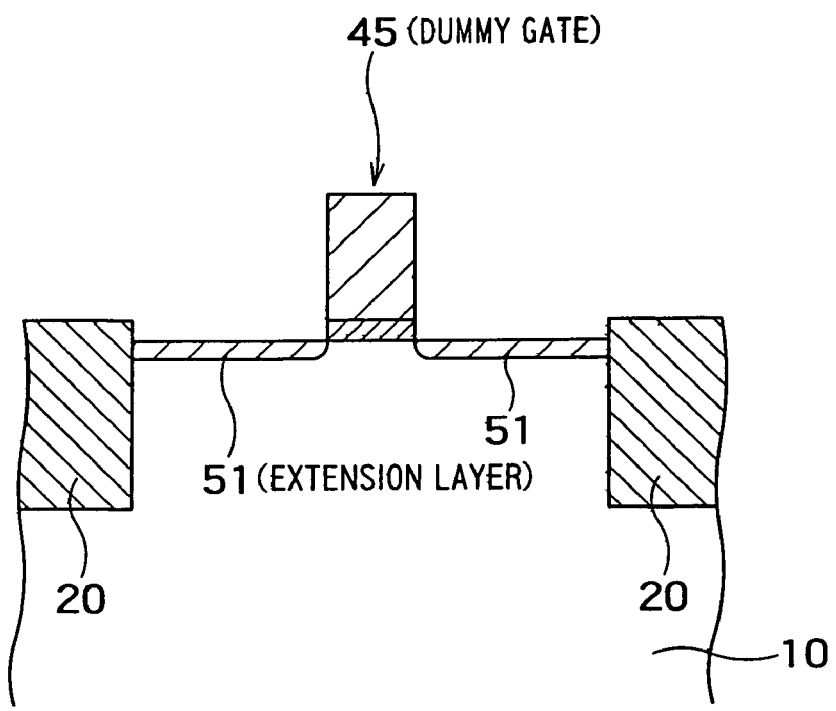

As shown in FIG. 2, the buffer dielectric film 30 and the polysilicon 40 in the gate electrode formation region are kept as they are, and the buffer dielectric film 30 and the polysilicon 40 in other regions are removed by using a lithographic technique and RIE. The buffer dielectric film 30 and the polysilicon 40 provided in the gate electrode formation region are used as a dummy gate 45. A surface pattern of the dummy gate 45 is the same as a surface pattern of the gate electrode formed in a subsequent process.

Impurity ion is then implanted into the semiconductor substrate 10, using the dummy gate 45 as a mask. The silicon substrate 10 is heat treated to activate the impurity and recover from a crystal defect of the silicon substrate 10. As a result, an extension layer 51 is formed in self alignment, as shown in FIG. 2.

Figure 3:
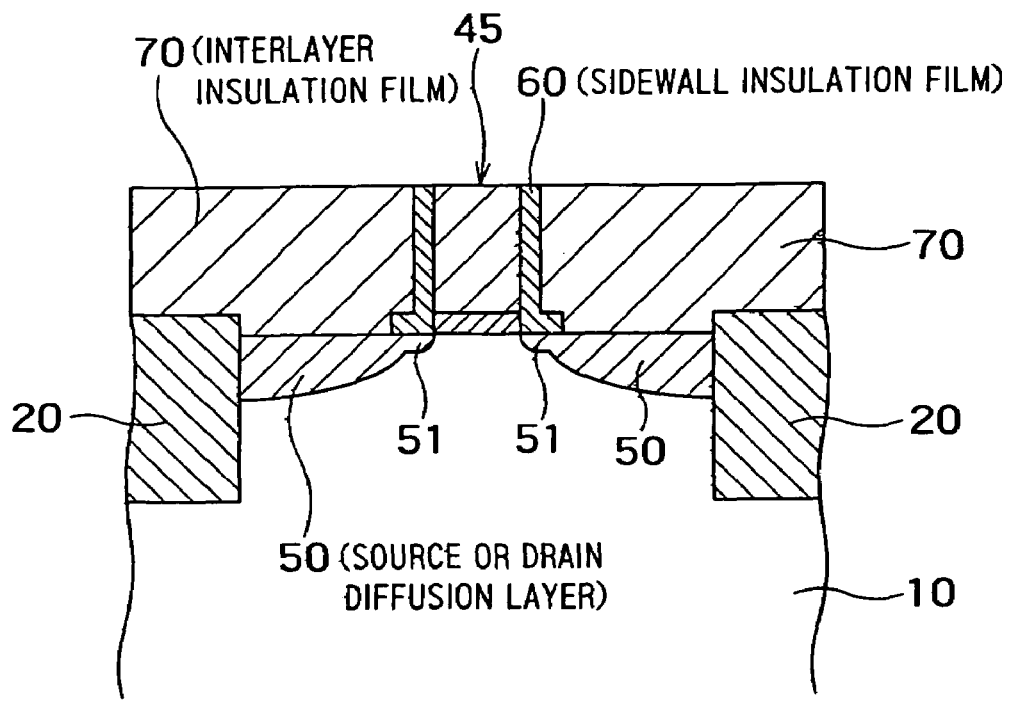

A material of a sidewall dielectric film 60 made of silicon nitride film is deposited on the silicon substrate 10 to cover the dummy gate 45. An dielectric film formed by using tetraethoxysilane (hereinafter, "TEOS film") is deposited on the sidewall dielectric film 60. The material of the sidewall dielectric film 60 and the TEOS film are anisotropically etched, thereby forming the sidewall dielectric film 60 on the sidewall of the dummy gate 45 as shown in FIG. 3.

Impurity ion is then implanted into the semiconductor substrate 10 by using the dummy gate 45 and the sidewall dielectric film 60 as a mask. The silicon substrate 10 is heat treated to activate the impurity and recover from a crystal defect of the silicon substrate 10. As a result, the source/drain diffusion layer 50 is formed in self alignment, as shown in FIG. 3. Silicide can be formed on the source/drain diffusion layer 50.

An interlayer dielectric film 70 made of TEOS film is deposited on the silicon substrate 10 to cover the dummy gate 45 and the sidewall dielectric film 60. The surface of the interlayer dielectric film 70 is flattened by CMP to expose the upper surface of the dummy gate 45, thereby obtaining a configuration as shown in FIG. 3.

Figure 4:
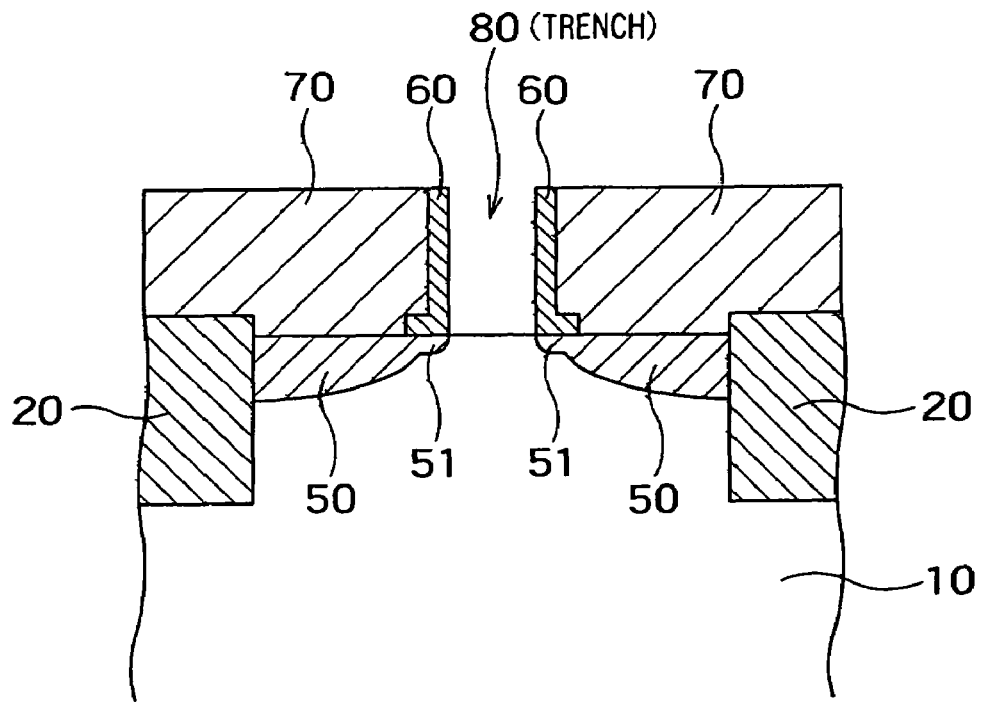

The dummy gate 45 is then removed, thereby forming a trench 80 in the region where a gate electrode is formed in the subsequent process, as shown in FIG. 4. The trench 80 passes through the interlayer dielectric film 70, and reaches the silicon substrate 10. A surface of the silicon substrate 10 is exposed on the bottom surface of the trench 80. A sidewall of the trench 80 is made of the sidewall dielectric film 60. A channel ion implantation and an activation annealing are performed when necessary. As a result, an impurity concentration profile in the channel region is completed.

Figure 5:
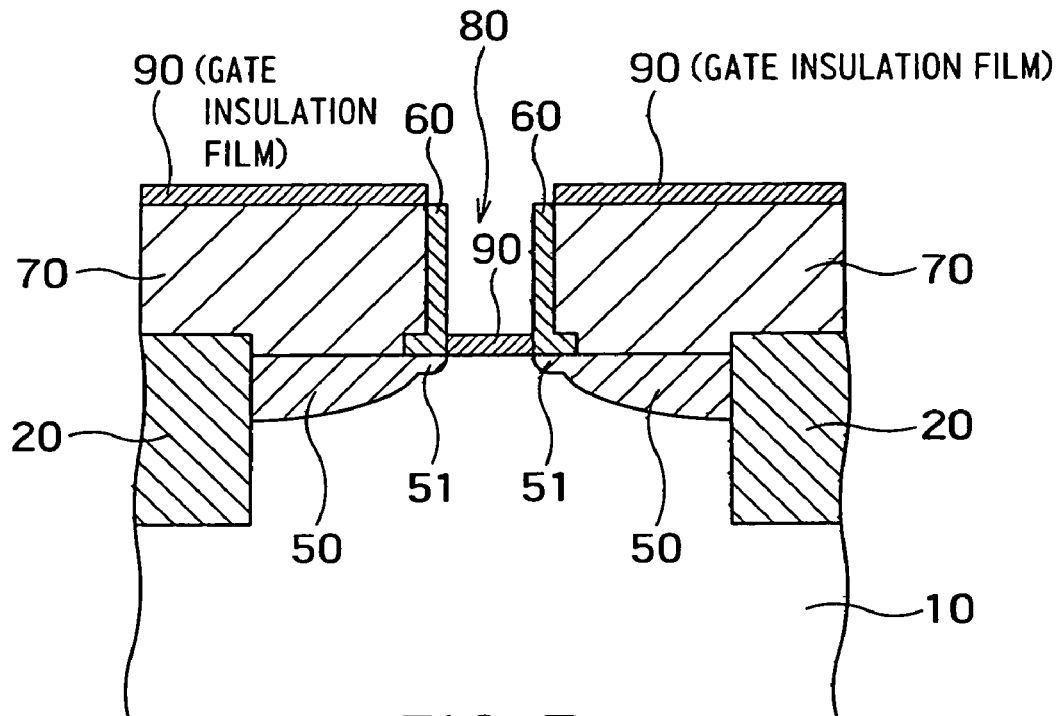

As shown in FIG. 5, a gate insulation film 90 of a HfSiO film is deposited by using a MOCVD (metal organic chemical vapor deposition) method. In this case, the HfSiO film is deposited on the bottom surface of the trench 80 made of the semiconductor substrate 10, instead of on the sidewall of the trench 80, or the sidewall dielectric film 60. To this end, the HfSiO film needs to be deposited at a lower processing temperature than that according to the conventional MOCVD method. Conditions for depositing HfSiO film are explained below with reference to FIGS. 7A and 7B.

Figure 7B:
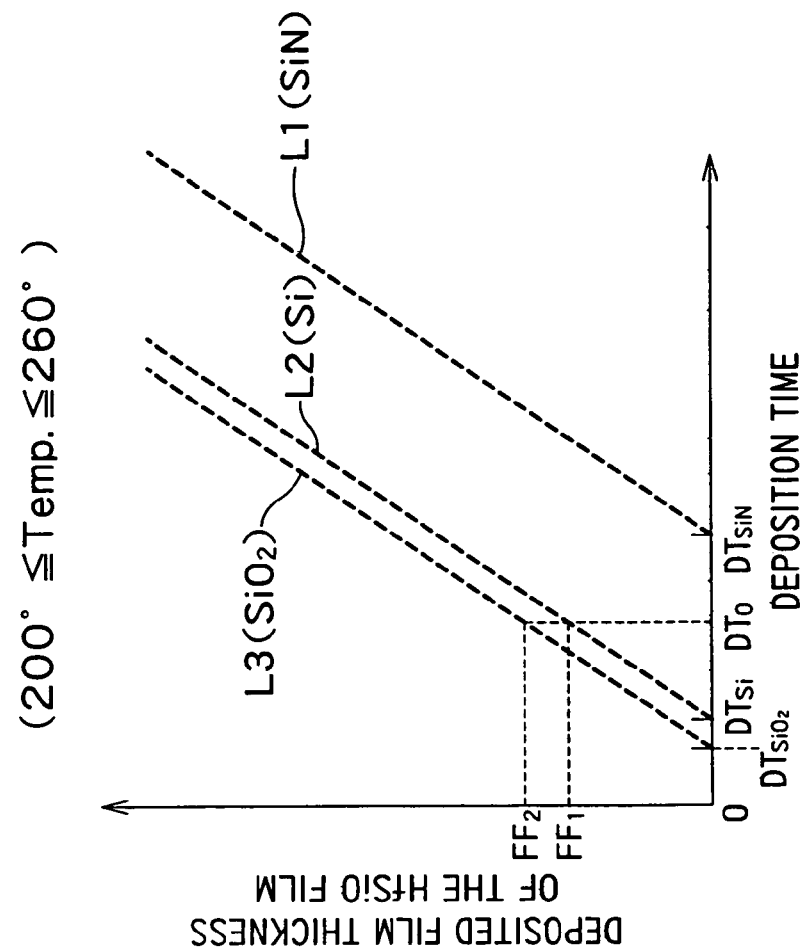
FIGS. 7A and 7B are graphs showing a relationship between a deposition delay time and a film thickness of the HfSiO film at the time of depositing the HfSiO film using the MOCVD method.
Figure 7A:
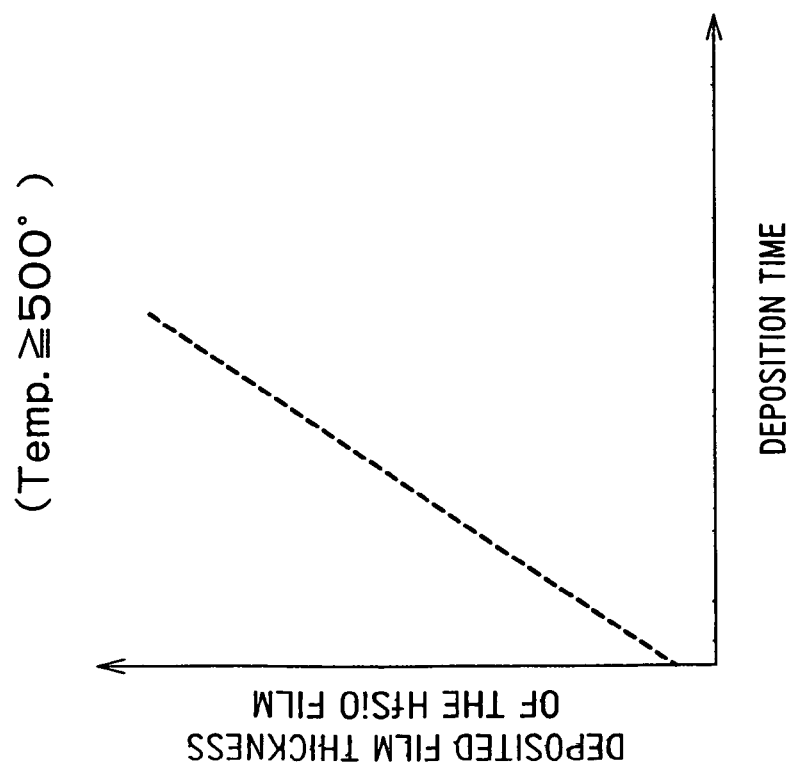

FIGS. 7A and 7B are graphs showing a relationship between a deposition delay time and a film thickness of the HfSiO film at the time of depositing the HfSiO film using the MOCVD method. The deposition delay time means a delay time of actually starting a deposition of the HfSiO film from a start of the deposit process.

For example, when a HfSiO film is deposited at 500 degrees centigrade or above, a deposition delay time is zero, regardless of a material of the ground, as shown in FIG. 7A.

On the other hand, when a HfSiO film is deposited at 260 degrees centigrade or below, a deposition delay time is observed. The deposition delay time is dependent on a material that becomes the ground of deposition, as shown in FIG. 7B. For example, when the material of the ground is a silicon nitride film, a deposition delay time $DT_{SiN}$ is relatively long. When the ground material is silicon single crystal, a deposition delay time $DT_{Si}$ is shorter than $DT_{SiN}$. When the ground material is a silicon dioxide film, a deposition delay time $DT_{SiO2}$ is shorter than $DT_{Si}$.

Figure 8:
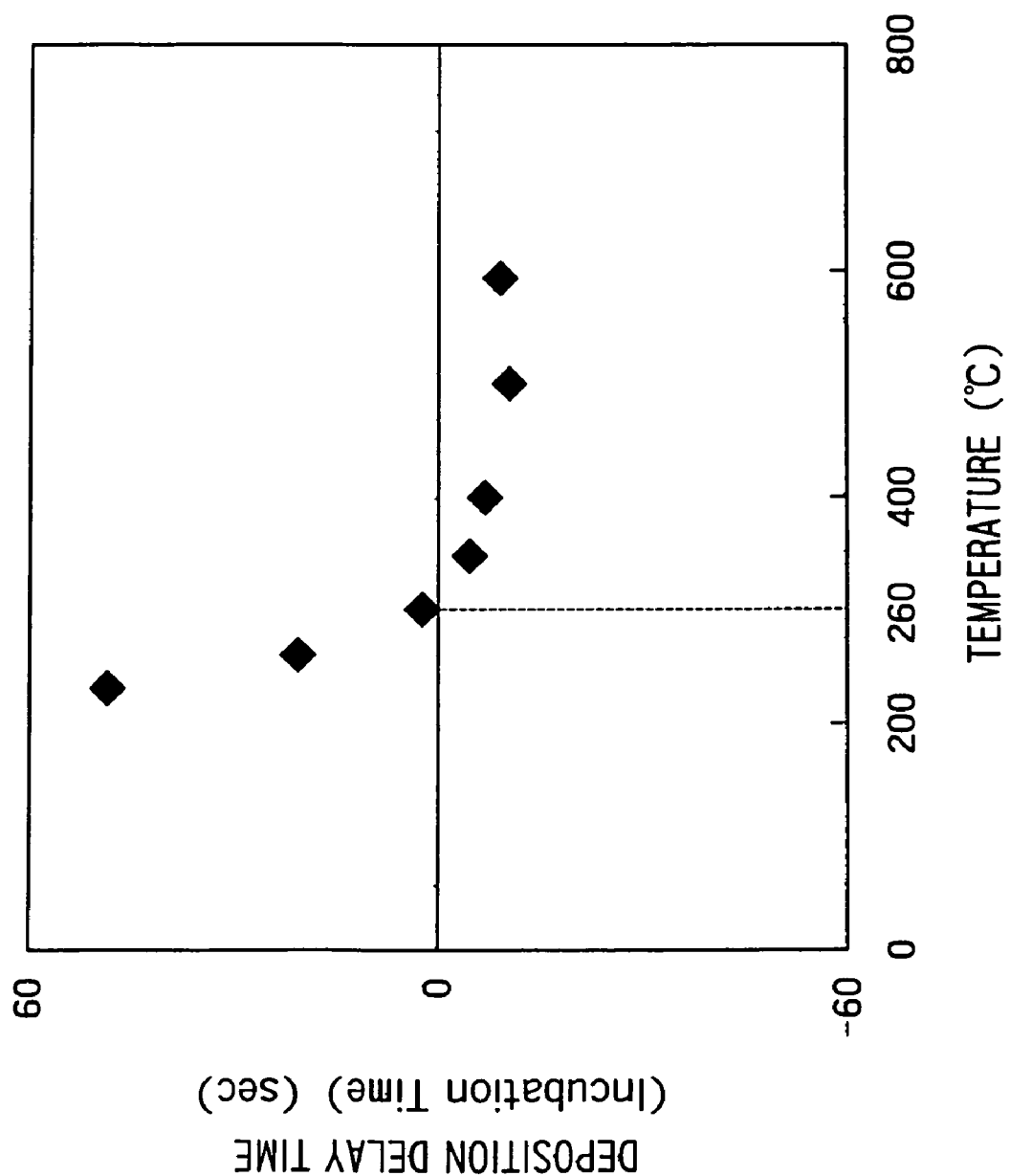
FIG. 8 is a graph showing a relationship between a processing time of MOCVD and a deposition delay time of the HfSiO film.

FIG. 8 is a graph showing a relationship between a processing time of MOCVD and a deposition delay time of the HfSiO film. It is clear from FIG. 8 that a temperature equal to or above 200 degrees centigrade is necessary to deposit the HfSiO film. When the processing temperature exceeds 260 degrees centigrade, the deposition delay time becomes equal to zero or below. Therefore, the HfSiO film needs to be deposited at a temperature equal to or above 200 degrees centigrade and equal to or below 260 degrees centigrade.

When an actual deposition time $DT_0$ is set between the delay time $DT_{Si}$ and $DT_{SiN}$ in this temperature condition (200~260 degrees centigrade), the gate dielectric film 90 made of the HfSiO film is deposited on the bottom surface of the trench 80 made of silicon single crystal without being deposited on the sidewall dielectric film 60 made of the silicon nitride film, as shown in FIG. 5. In FIG. 7B, a film thickness of the HfSiO film deposited on the bottom surface of the trench 80 is expressed as $FT_1$. While the HfSiO film is also deposited on the interlayer dielectric film 70 made of the TEOS film, the HfSiO film is not always necessary to be deposited on the interlayer dielectric film 70.

This HfSiO film is nitrided by using nitrogen plasma or a $NH_3$ annealing process. Thereafter, the HfSiO film is heat treated at a temperature within a range from 900 degrees centigrade to 1,100 degrees centigrade in nitrogen or oxygen atmosphere. With this arrangement, crystal defect of the HfSiO film decreases, and the HfSiO film becomes extremely precise.

When the crystal defect of the HfSiO film is not so significant, however, it is not always necessary to perform either one of or both the nitriding and the heat treating.

Figure 6:
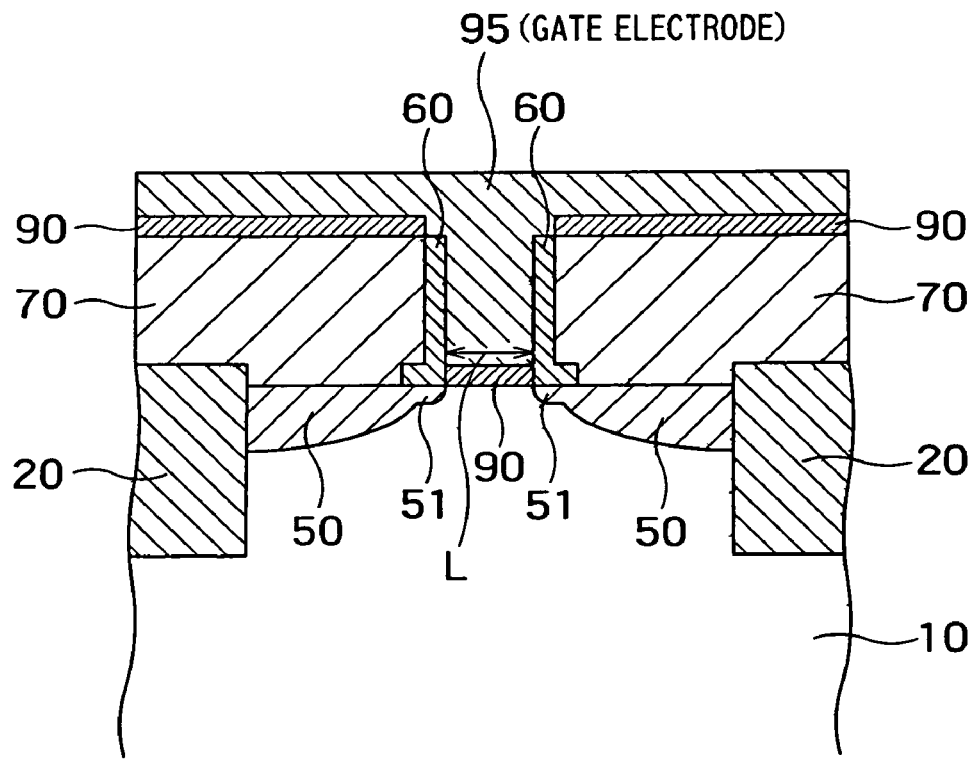

As shown in FIG. 6, metal is deposited as a material of a gate electrode 95. As a result, metal is filled in the trench 80. This metal is polished by using CMP or the like, thereby the gate electrode 95 is formed.

Thereafter, an interlayer dielectric film, a contact hole, and a wiring are formed, through a process similar to the conventional process, thereby forming a semiconductor device.

According to this embodiment, the trench 80 for the gate is formed by using a Damascene process. Alternatively, the trench 80 can be formed by patterning the interlayer dielectric film by using a lithographic technique and RIE. In this case, a silicon nitride film is used for the interlayer dielectric film 70, thereby avoiding the need of forming the sidewall dielectric film 60. When a silicon nitride film is used for the interlayer dielectric film 70, the interlayer dielectric film 70 is etched by RIE, using a silicon dioxide film or the like as a hard mask. Preferably, a protection film is provided between the interlayer dielectric film 70 and the silicon substrate 10. This protection film can be a silicon dioxide film.

According to this embodiment, an HfSiO film is deposited at a temperature equal to or above 200 degrees centigrade and equal to or below 260 degrees centigrade which is lower than the conventional deposition temperature. As a result, the HfSiO film is not deposited on the sidewall of the trench 80. Therefore, the original gate length or the gate width of the gate electrode 95 can be maintained without decreasing the gate length or the gate width of the gate electrode 95. Consequently, a distance between the extension layer 51 and the gate electrode 95 can be made small, and a reduction in the on-current and a short-channel effect can be suppressed.

Second Embodiment

Figure 9:
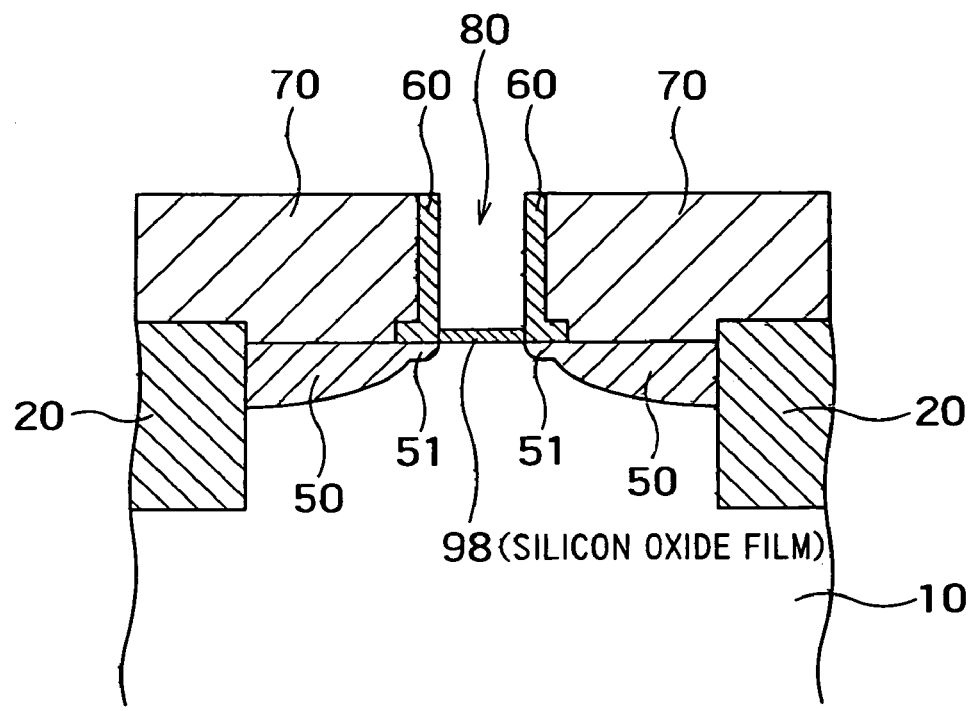
FIGS. 9 to 11 are cross-sectional views of a semiconductor device showing a method of manufacturing the semiconductor device according to a second embodiment.
Figure 10:
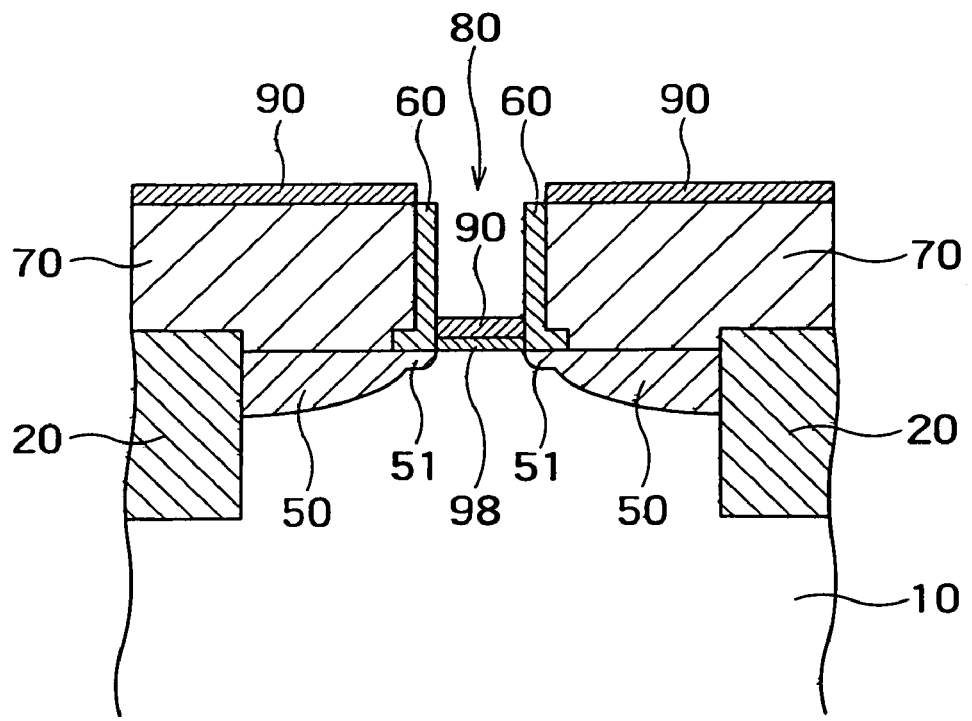
Figure 11:
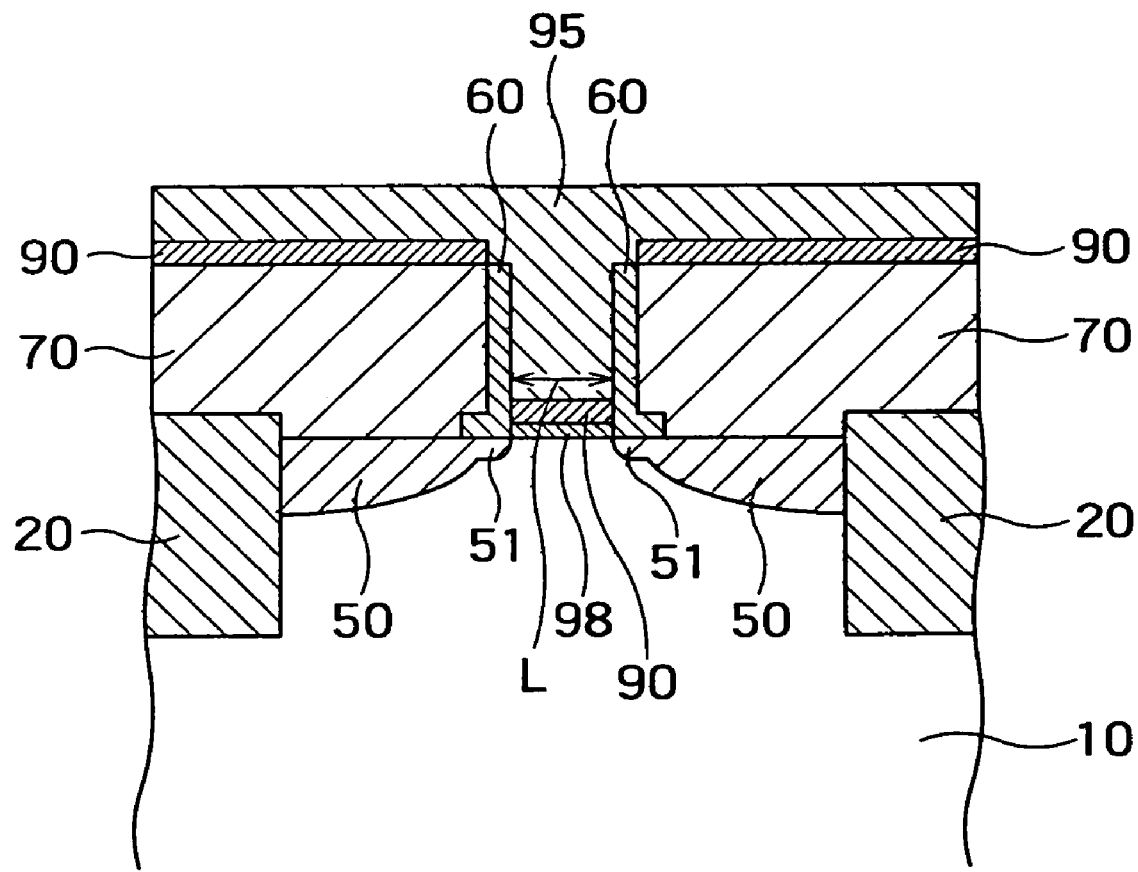

FIGS. 9 to 11 are cross-sectional views of a semiconductor device showing a method of manufacturing the semiconductor device according to a second embodiment of the present invention. The second embodiment is different from the first embodiment in that a silicon dioxide film 98 is provided in a part of the gate dielectric film. The method of manufacturing a semiconductor device according to the second embodiment is similar to that according to the first embodiment from the process shown in FIG. 1 to the process shown in FIG. 4. Therefore, explanation of these processes is omitted.

As shown in FIG. 9, a silicon dioxide film 98 is formed as a part of the gate dielectric film on the silicon substrate 10. The silicon dioxide film 98 can be oxidized by heating the silicon substrate in the oxygen atmosphere. However, as long as a silicon nitride film of the sidewall dielectric film 60 is not oxidized, there is no limit to a method of forming the silicon dioxide film 98. Therefore, the silicon dioxide film 98 can be formed by radical oxidation, plasma oxidation, or chemical oxidation.

A HfSiO film is then deposited on the basis of the deposition condition explained with reference to FIG. 7B. In this case, the deposition time $DT_0$ is set between $DT_{SiO2}$ and $DT_{SiN}$. As a result, as shown in FIG. 10, the HfSiO film is deposited on the silicon oxide film 98 without being deposited on the sidewall dielectric film 60. A deposited film thickness of the HfSiO film is $FT_2$ which is larger than $FT_1$. According to the second embodiment, the gate dielectric film includes the HfSiO film 90 and the silicon dioxide film 98. Therefore, the thickness of the gate dielectric film is a sum of the thickness of the HfSiO film 90 and the thickness of the silicon dioxide film 98.

This HfSiO film is nitrided by using nitrogen plasma or a $NH_3$ annealing process. Thereafter, the HfSiO film is heat treated, for example, at a temperature within a range from 900 degrees centigrade to 1,100 degrees centigrade in nitrogen or oxygen atmosphere.

However, it is not always necessary to perform either one of or both the nitriding and the heat treating.

As shown in FIG. 11, metal is deposited as a material of a gate electrode 95. Thereafter, a process similar to that according to the first embodiment is performed, thereby completing a semiconductor device.

As shown in FIG. 7B, the HfSiO film is deposited in a larger thickness on the silicon dioxide film than on silicon under the same deposition condition. Therefore, according to the second embodiment, the HfSiO film can be formed in a larger thickness than that according to the first embodiment.

A HfSiO film can be deposited in a shorter time on a silicon dioxide film than on silicon to have the same film thickness. According to the second embodiment, the actual deposition time $DT_0$ can be set to a larger range from $DT_{SiO2}$ to $DT_{SiN}$ than the setting range from $DT_{Si}$ to $DT_{SiN}$ according to the first embodiment.

Furthermore, the second embodiment has an effect similar to that of the first embodiment.

In the first and the second embodiments, a SOI (silicon on insulator) substrate can be used in place of the silicon substrate 10 for the semiconductor substrate.

Third Embodiment

Figure 12:
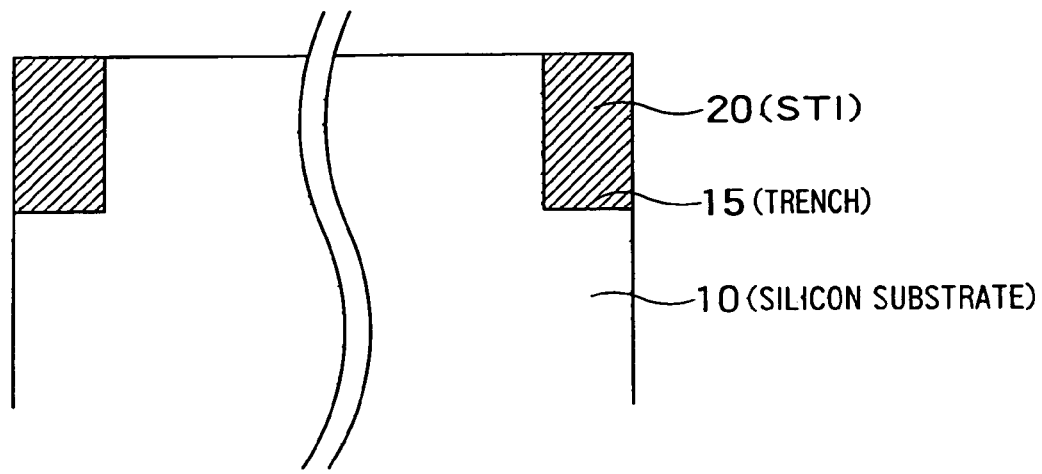
FIGS. 12 to 17 are cross-sectional views of a semiconductor device showing a method of manufacturing the semiconductor device according to a third embodiment.

FIGS. 12 to 17 are cross-sectional views of a semiconductor device showing a method of manufacturing the semiconductor device according to a third embodiment of the present invention. As shown in FIG. 12, a STI as an element isolation region is formed on the silicon substrate 10 by using a known method.

An STI is formed in the following method, for example. A buffer film not shown and a silicon nitride film not shown are deposited on the silicon substrate 10. A silicon nitride film is then formed in a pattern of an active area by using a photolithographic technique or RIE. The buffer film and the silicon substrate 10 are etched to a predetermined depth by using the patterned silicon nitride film as a mask, thereby forming a trench 15 on the silicon substrate 10. After a resist remaining on the silicon nitride film is removed, a silicon dioxide film is deposited, thereby the silicon dioxide film is filled in the trench 15. Thereafter, the silicon dioxide film is flattened by CMP or the like. The silicon nitride film is removed to complete an STI.

Figure 13:
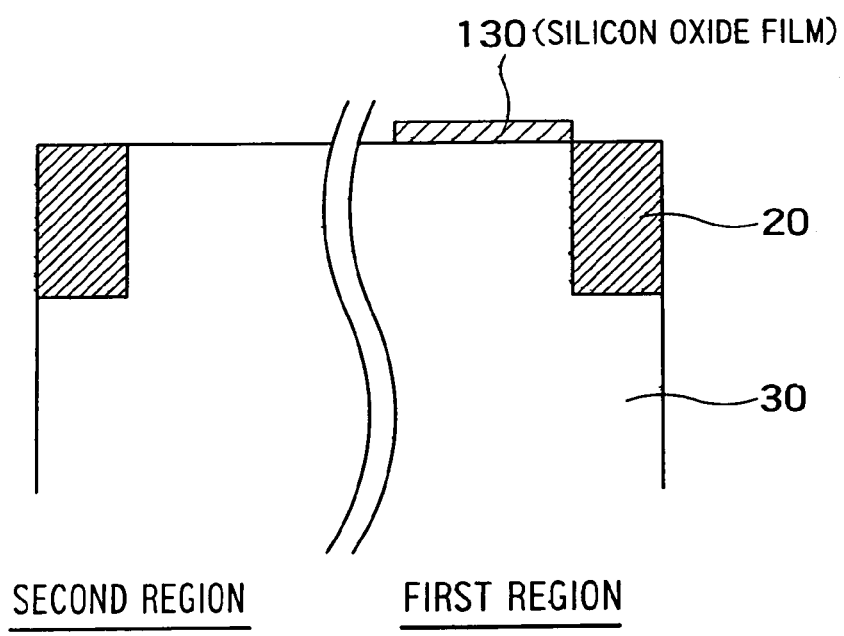

A silicon dioxide film 130 is then formed on the silicon substrate 10 by using a known method, as shown in FIG. 13. For example, the silicon dioxide film 130 can be formed by thermally oxidizing the silicon substrate in the oxygen atmosphere. Subsequently, an intended region of the silicon dioxide film 130 is removed by using a photolithographic technique and RIE, thereby exposing the silicon substrate 10 in the intended region. The silicon dioxide film 130 can be wet etched by using hydrofluoric acid, for example. The intended region of the silicon dioxide film 130 can be also removed by using an etching method such as RIE and CDE (chemical dry etching). The remaining silicon dioxide film 130 remaining after the etching is used as a part of the gate dielectric film. A surface area of the silicon substrate 10 on which the silicon dioxide film 130 is provided is supposed to be a first region, and a surface area of the silicon substrate 10 on which the semiconductor material is exposed is supposed to be a second region.

Figure 14:
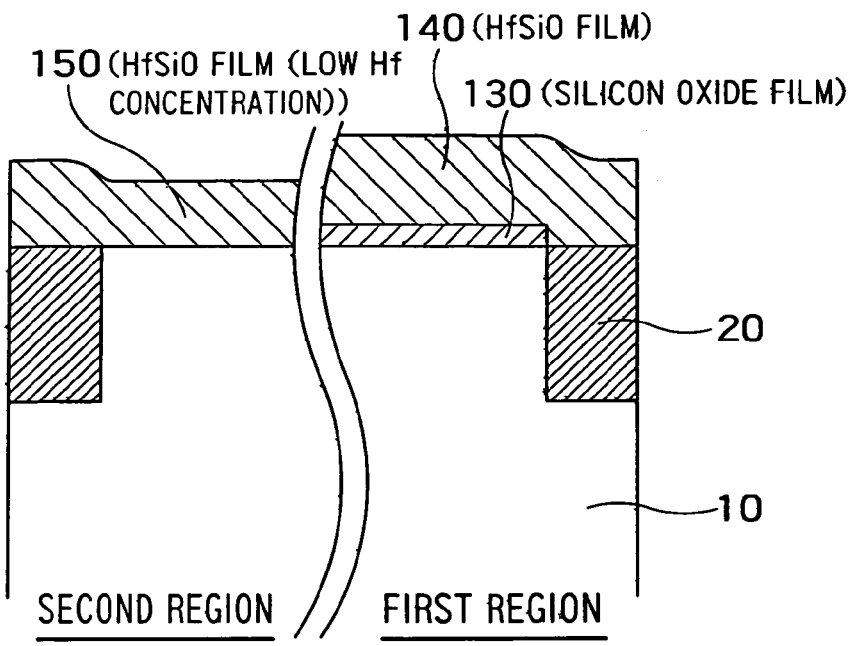

A HfSiO film as a gate dielectric film is then deposited at a temperature equal to or above 200 degrees centigrade and equal to or below 260 degrees centigrade by using the MOCVD method. The HfSiO film is formed using at least one of tetrakis-dimethyl-amino-silicon, tetrakis-diethyl-amino-silicon, tetrakis-ethyl-methyl-amino-silicon, trimethyl-amino-silicon, triethyl-amino-silicon, Bis-dimethyl-amino-silane, diethyl-silane, and dichloro-silane as a silicon material, and at least one of tetrakis-diethyl-amino-hafnium, tetrakis-ethyl-methyl-hafnium, tetrakis-ethyl-amino-hafnium hafnium-tetra-tirtial-butoxyde (Hf(Ot-Bu)$_4$), and Hf(MMP)$_4$(Hf(OC(CH$_3$)$_2$CH$_2$OCH$_3$)$_4$) as a hafnium material. When a HfSiO film is deposited at a temperature equal to or above 200 degrees centigrade and equal to or below 260 degrees centigrade by using the MOCVD method, a deposition delay time is different depending on a ground material (see FIG. 18A). As shown in FIG. 18B, when an atmospheric pressure of forming the HfSiO film is decreased, the delay time increases. According to this embodiment, while a film formation pressure is 7.5 Torr, an atmospheric pressure having a sufficient delay time can be selected from a range of 2.5 Torr to 8 Torr. With this arrangement, as shown in FIG. 14, a HfSiO film 150 having a relatively thin thickness is deposited in the second region (on the silicon substrate 10), and a HfSiO film 140 having a relatively thick thickness is deposited in the first region (on the silicon dioxide film 130). Hafnium concentration of the HfSiO film 140 deposited in the first region (on the silicon dioxide film 130) becomes higher than hafnium concentration of the HfSiO film 150 deposited in the second region (on the silicon substrate 10). The HfSiO films 140 and 150 will be described with reference to FIGS. 18 to 20.

Figure 15:
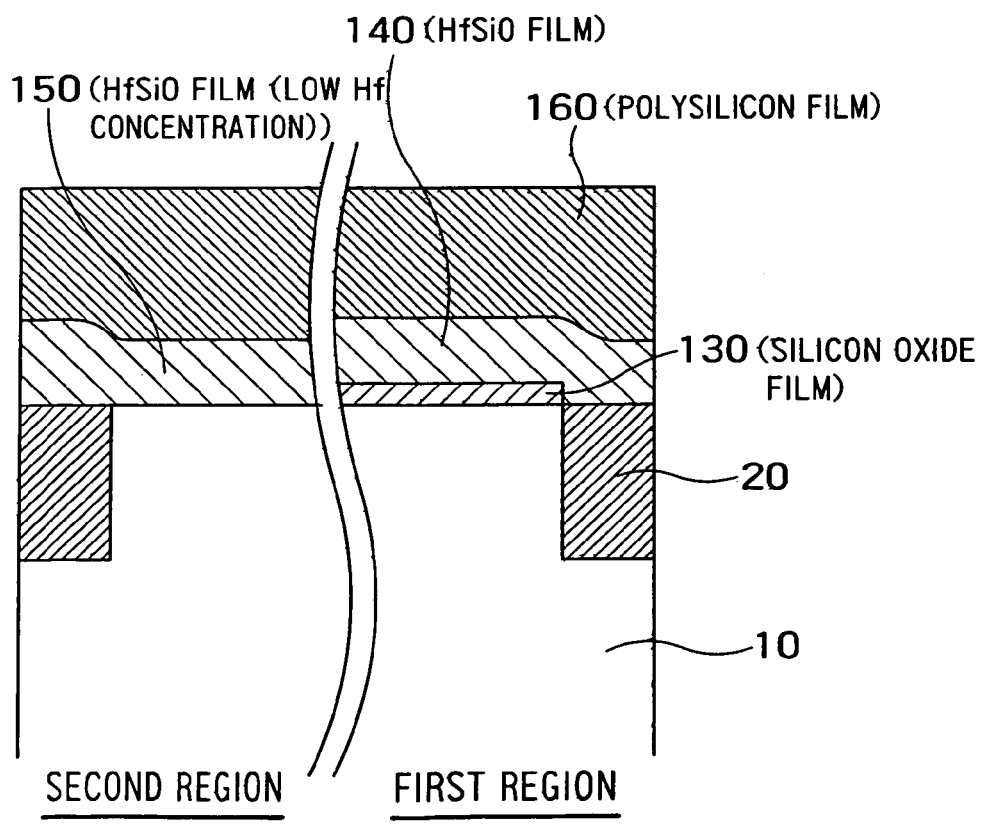

As shown in FIG. 15, polysilicon 160 is deposited as a gate electrode material on the HfSiO films 140 and 150.

Figure 16:
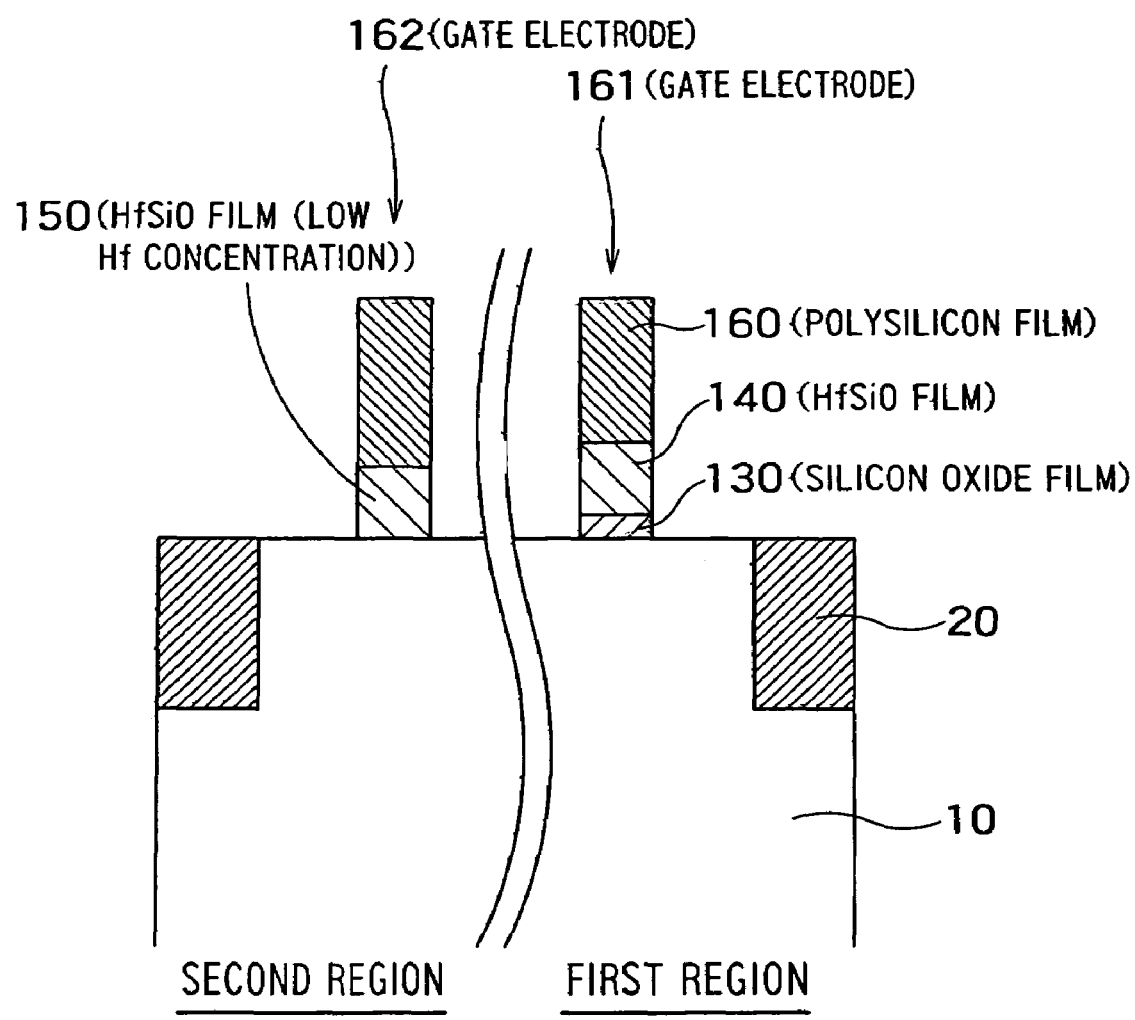

As shown in FIG. 16, the polysilicon 160, the HfSiO film 140, the HfSiO film 150, and the silicon dioxide film 130 are etched in a gate electrode pattern, thereby forming gate electrodes 161 and 162.

Figure 17:
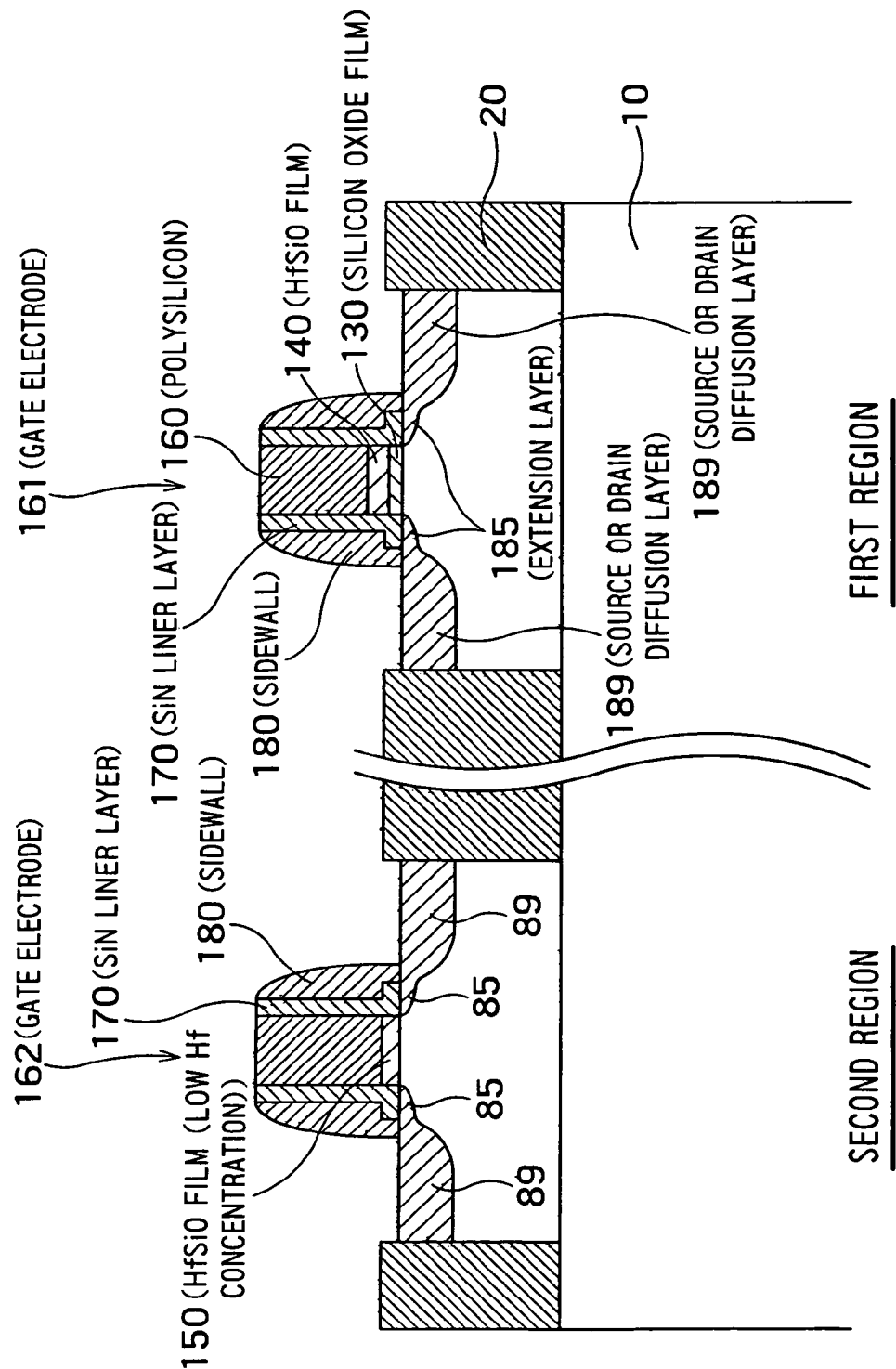

Ion implantation for forming an extension and annealing for recovering from crystal defect are performed, if necessary. As a result, an extension layer 185 is formed as shown in FIG. 17. A silicon nitride film is deposited, and a SiO$_2$ film formed by using TEOS (tetraethoxysilane) and oxygen or ozone (hereinafter, "TEOS film") is deposited. A SiN liner layer 170 and a sidewall 180 are formed on the side surfaces of the gate electrodes 161 and 162 by anisotropically etching the silicon nitride film and the TEOS film.

Impurity ion is then implanted, and annealing is performed to activate the impurity. As shown in FIG. 17, source/drain diffusion layers 189 are formed as a result. If necessary, a silicide film is formed on the source/drain diffusion layer.

Thereafter, an interlayer dielectric film, a contact, and a wiring may be formed by using a conventional method. For example, after the TEOS film is deposited on the whole surface as the interlayer dielectric film, this TEOS film is flattened by CMP. Subsequently, a contact hole is formed on the TEOS film. Titanium or titanium nitride is deposited on the source/drain diffusion layer or on silicide formed on the source/drain diffusion layer, and the deposition result is heat treated. Thereafter, tungsten is deposited to fill the contact hole. The tungsten is flattened to form a contact. A wiring made of titanium, titanium nitride, or aluminum is formed, thereby completing a semiconductor device.

Figure 18A:
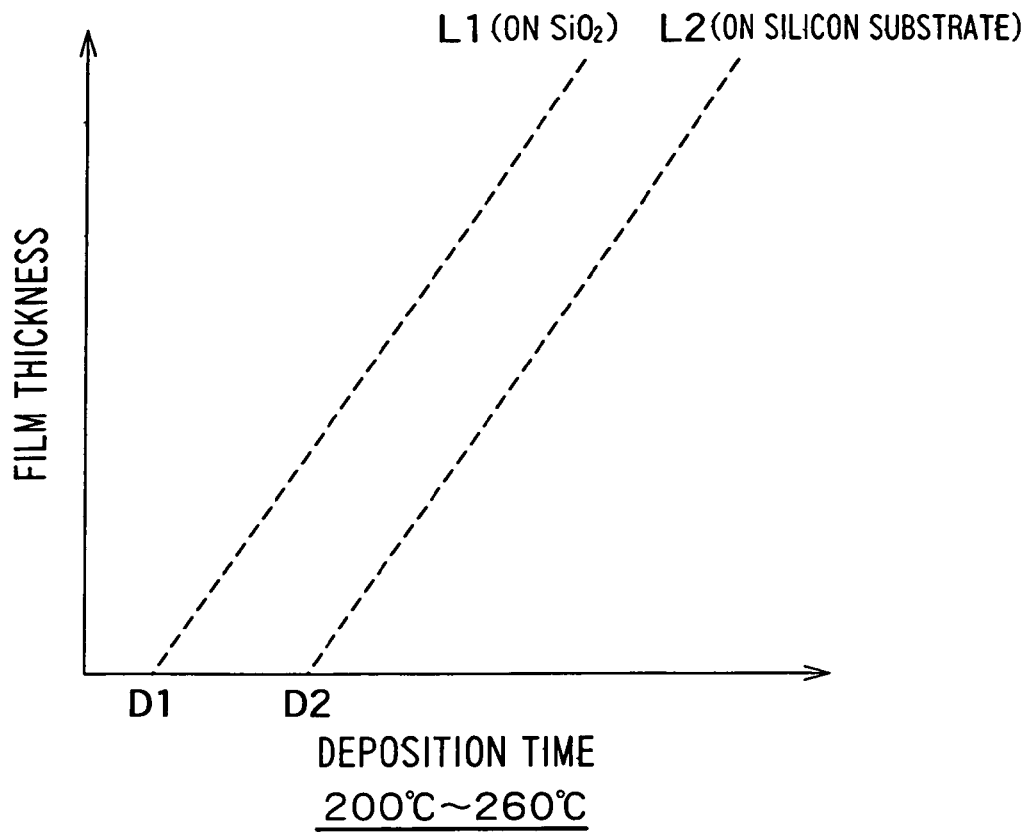
FIGS. 18 and 19 are graphs showing a deposition delay time when HfSiO is deposited using the MOCVD method.
Figure 18B:
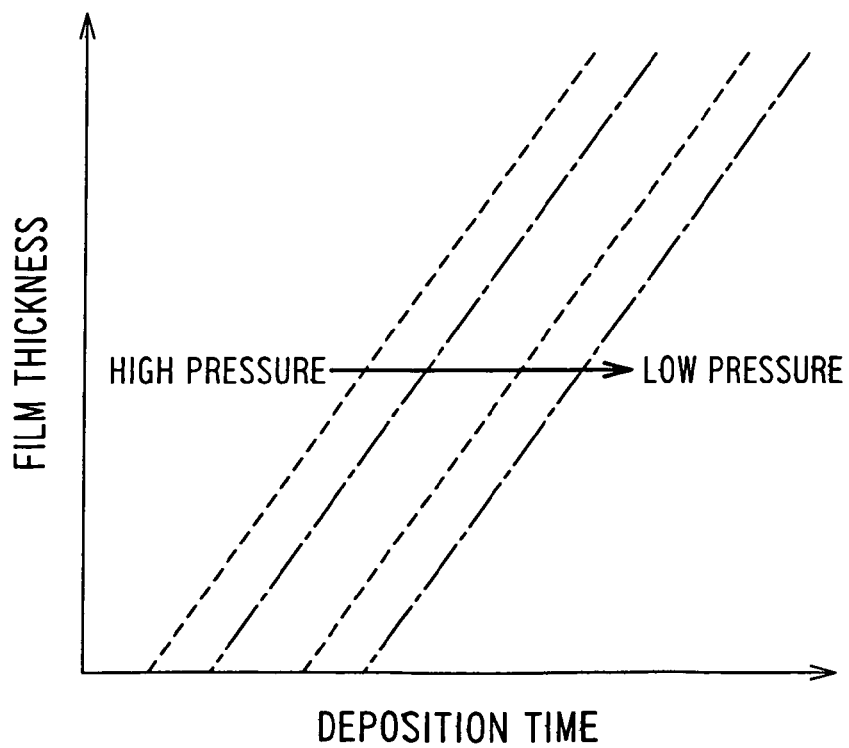
Figure 19:
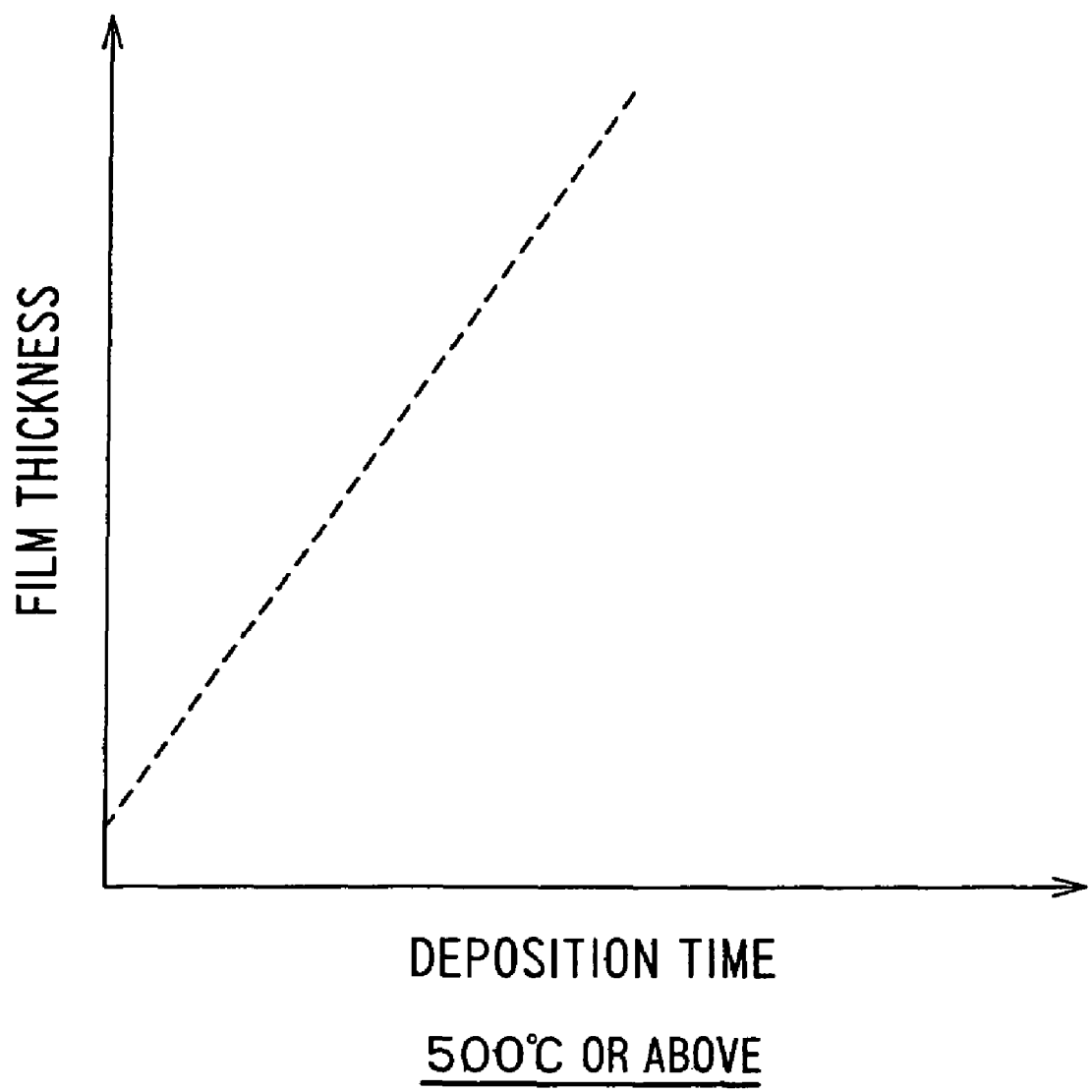

FIGS. 18A, 18B and 19 are graphs showing a deposition delay time when HfSiO is deposited using the MOCVD method. As shown in FIGS. 18A and 18B, in the low temperature condition of about 200 degrees centigrade to 260 degrees centigrade, actual deposition of HfSiO is started after a delay of a certain time since the deposition process is started. For example, when the ground material is the silicon substrate 10, deposition of HfSiO is actually started after a lapse of the delay time D1 since the deposition process is started. When the ground material is the silicon dioxide film 130, deposition of HfSiO is actually started after a lapse of the delay time D2 since the deposition process is started. The delay time D1 is shorter than the delay time D2.

On the other hand, in a relatively high temperature condition of 500 degrees centigrade or above, HfSiO is actually deposited from the deposition process starting time as shown in FIG. 19. In other words, at a temperature of 500 degrees centigrade or above, a deposition delay time is not observed.

Figure 20:
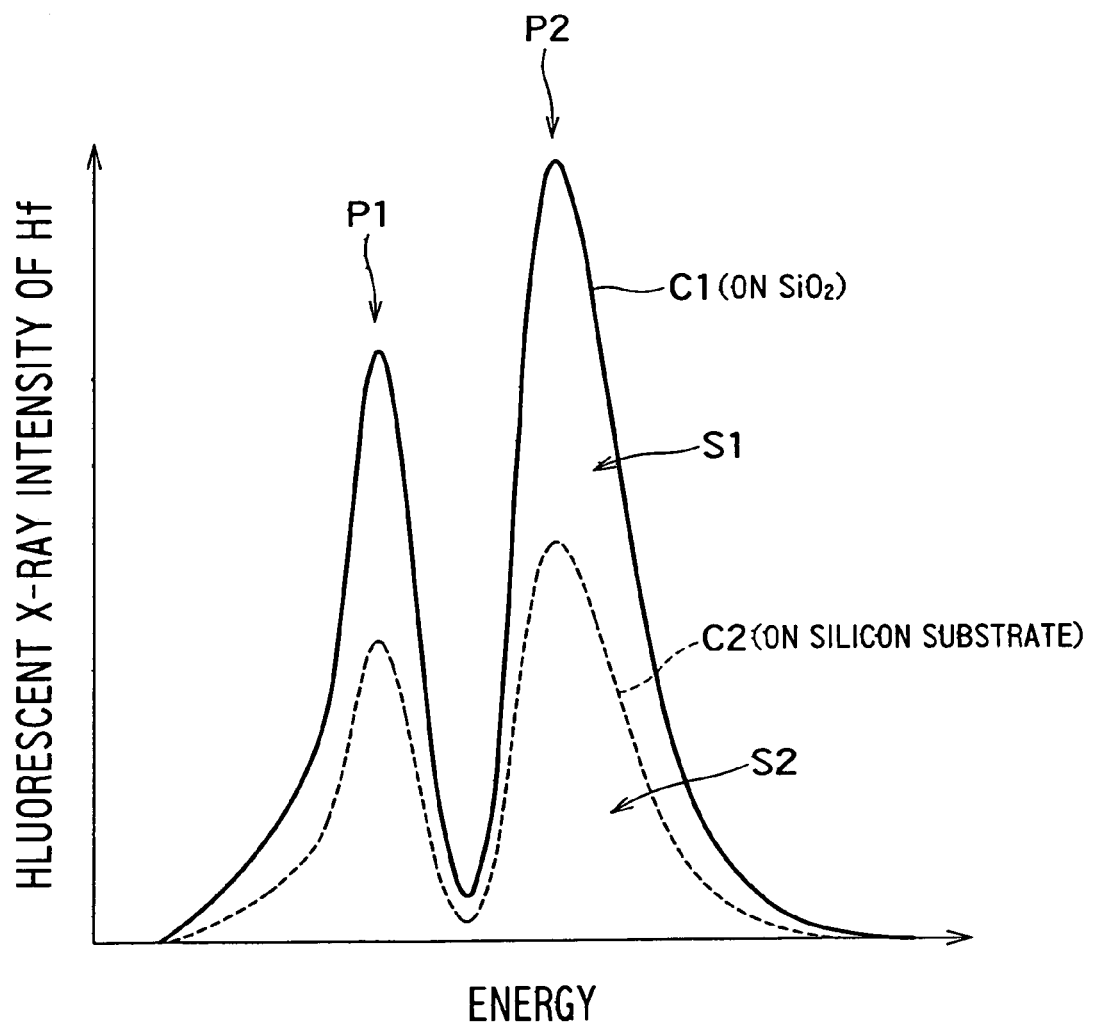
FIG. 20 is a result of investigating characteristic X-ray intensity in the HfSiO films 140 and 150.

FIG. 20 is a result of investigating characteristic X-ray intensity in the HfSiO films 140 and 150 according to an X-ray fluorescent analysis method to study hafnium concentration after forming the HfSiO films 140 and 150. Two peaks P1 and P2 show spectra of hafnium. A curve C1 expresses X-ray intensity in the HfSiO film 140 deposited on the first region (on the silicon dioxide film 130), and a curve C2 expresses X-ray intensity of the HfSiO film 150 deposited on the second region (on the silicon substrate 10).

An area S1 of a region encircled by the curve C1 and the X axis expresses the amount of hafnium included in the HfSiO film 140. An area S2 of a region encircled by the curve C2 and the X axis expresses the amount of hafnium included in the low-concentration HfSiO film 150. Therefore, a relative concentration of hafnium in the HfSiO film 140 and the low-concentration HfSiO film 150 can be obtained by dividing the area S1 by a film thickness of the HfSiO film 140 and by dividing the area S2 by a film thickness of the low-concentration HfSiO film 150.

Figure 21:
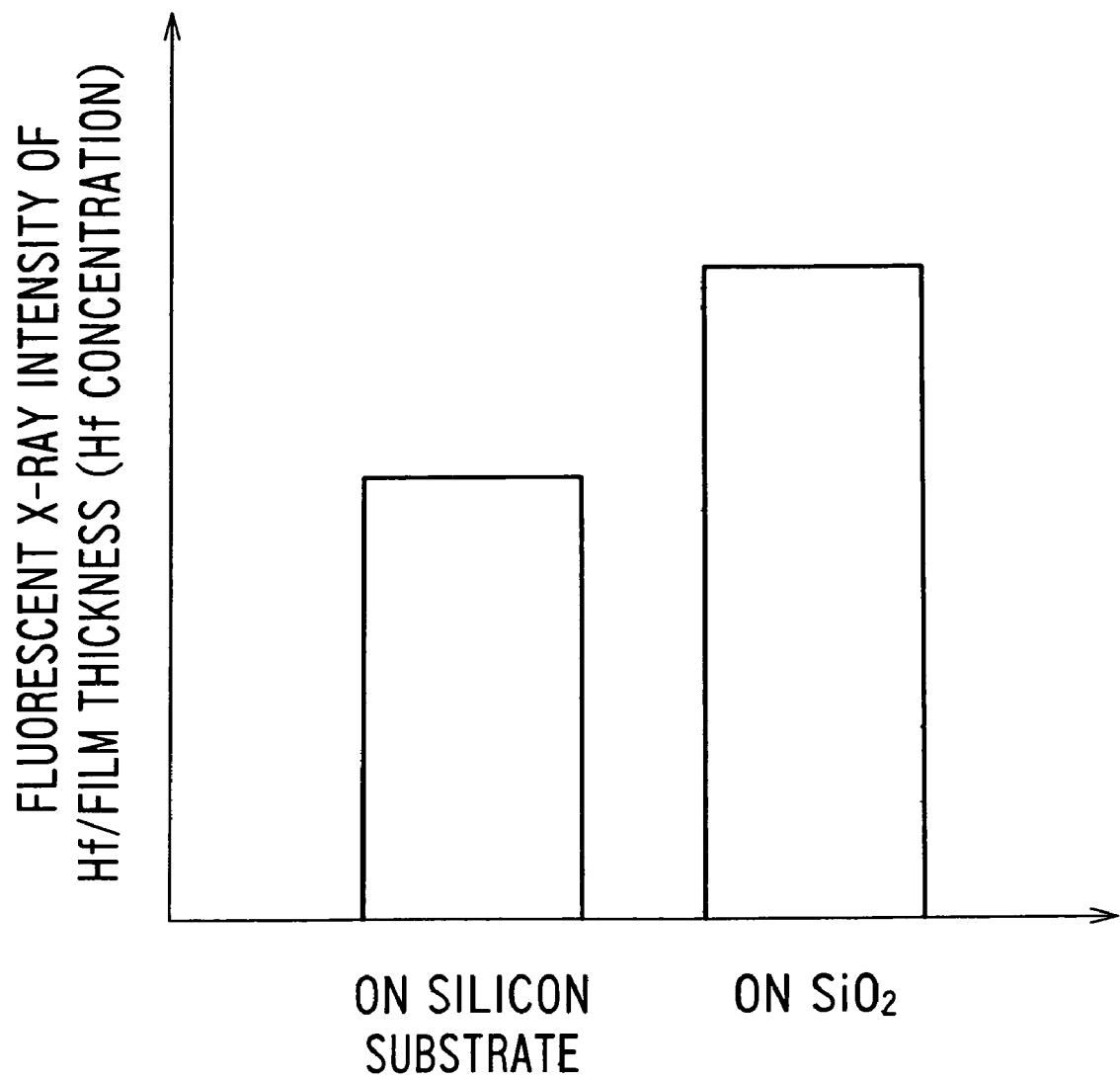
FIG. 21 is a graph showing hafnium concentrations in the HfSiO film 140 and in the HfSiO film 150.

FIG. 21 is a graph showing hafnium concentrations in the HfSiO film 140 and in the HfSiO film 150, respectively. It is clear from this graph that the hafnium concentration in the HfSiO film 140 formed in the first region (on the silicon dioxide film 130) is higher than the hafnium concentration in the HfSiO film 150 formed in the second region (on the silicon substrate 10).

FIG. 22 is a table showing one example of a process of forming a HfSiO film according to this embodiment. Hafnium concentration in the HfSiO film 140 and hafnium concentration in the HfSiO film 150 are compared with each other based on the example shown in FIG. 22. In this example, the HfSiO films 140 and 150 are deposited for about three minutes at about 230 degrees centigrade using the MOCVD. A film thickness of the silicon oxide film 130 is about three nanometers.

In this case, a film thickness of the HfSiO film 140 is about 9.20 nanometers, and a film thickness of the HfSiO film 150 is about 5.87 nanometers. The area S1 is 1,455.95, and the area S2 is 704.20. The area S1 is divided by the film thickness of the HfSiO film 140 to obtain 158.2. The area S2 is divided by the film thickness of the HfSiO film 150 to obtain 120.0.

In other words, when the HfSiO films 140 and 150 are formed in the above condition, the hafnium concentration of the HfSiO film 150 is lower than that of the HfSiO film 140 by about 24%.

In general, when the hafnium concentration is set high, the gate dielectric film has a high dielectric constant, but reliability of a breakdown voltage and lifetime becomes low. Therefore, the HfSiO film 140 can maintain a high dielectric constant because of relatively high hafnium concentration. The HfSiO film 140 has relatively high hafnium concentration, but has a relatively large physical film thickness. Therefore, the HfSiO film 140 can maintain a certain level of high reliability. The HfSiO film 140 is used for a gate dielectric film of a MISFET required to perform a high-speed operation.

On the other hand, because the HfSiO film 150 has relatively low hafnium concentration, dielectric constant of the HfSiO film 150 is not so high as that of the HfSiO film 140. The HfSiO film 150 has a smaller physical film thickness than that of the HfSiO film 140. However, because the HfSiO film 150 has lower hafnium concentration than that of the HfSiO film 140, the HfSiO film 150 has high reliability. This HfSiO film 150 is used for a gate dielectric film of a MISFET having high reliability (such as long life and high resistance to pressure), despite a low operation speed.

According to the present embodiment, a silicon oxide film is formed in advance in the region where high hafnium concentration is necessary, and silicon is exposed in the region where low hafnium concentration is required by utilizing the delay time shown in FIGS. 18A and 18B. Further, an HfSiO film is deposited in the temperature condition in which the delay time shown in FIGS. 18A and 18B are obtained. An HfSiO film having a small physical film thickness and low hafnium concentration is formed on the silicon, and an HfSiO film having a large physical film thickness and high hafnium concentration is formed on the silicon oxide film. As explained above, according to this embodiment, the HfSiO films 140 and 150 having mutually different hafnium concentrations and different film thicknesses can be formed in the same MOCVD process. As a result, MISFETs having mutually different characteristics can be formed in a short manufacturing process. This leads to cost reduction and stability of characteristics of the semiconductor device.

According to this embodiment, the silicon dioxide film 130 is formed by thermally oxidizing the silicon substrate 10. However, alternatively, the silicon dioxide film 130 can be also formed by radical oxidation, plasma oxidation, or chemical oxidation of the silicon substrate 10.

According to this embodiment, the silicon dioxide film 130 in the second region is removed by a photolithographic technique and wet etching. However, alternatively, after covering the first region with photoresist and depositing a silicon dioxide film in the first and the second regions, the photoresist on the first region can be lifted off together with the silicon dioxide film. In this arrangement, the silicon dioxide film 130 can be formed in only the second region.

According to this embodiment, a silicon nitride film and a silicon oxynitride film can be formed in place of the silicon dioxide film 130 in the second region. When the silicon nitride film or the silicon oxynitride film is used for the ground material, the ground material also works like the silicon dioxide film 130. The silicon nitride film or the silicon oxynitride film can be formed by radical nitriding, plasma nitriding, and heat nitriding using an ammonia atmosphere.

While the silicon substrate 10 is used in this embodiment, an SOI substrate can be used instead.

The present invention is not limited to the above embodiments, and can be variously modified within a range not deviating from the gist of the present invention.

The invention claimed is:

1. A method of manufacturing a semiconductor device comprising:
    forming a trench in an interlayer dielectric film on a semiconductor substrate, and forming a silicon dioxide film as a part of a gate dielectric film on the semiconductor substrate, the trench reaching the semiconductor substrate and having a sidewall made of silicon nitride film;
    depositing a gate dielectric film made of a HfSiO film as another part of the gate dielectric film, so that the HfSiO film is selectively deposited on the silicon dioxide film which is exposed at a bottom surface of the trench rather than on the silicon nitride film; and
    filling the trench with a gate electrode made of metal.

2. The method of manufacturing a semiconductor device according to claim 1, wherein:
    after depositing the silicon dioxide film as a part of the gate dielectric film, either one of or both nitriding and heat treating are performed to the HfSiO film.

3. The method of manufacturing a semiconductor device according to claim 1, further including:
    setting a temperature condition of depositing the HfSiO film so that a deposition delay time attributable to a material of the silicon nitride film and a deposition delay time attributable to a material of the silicon dioxide film are mutually different.

4. The method of manufacturing a semiconductor device according to claim 1, wherein:
    the HfSiO film is deposited on the silicon dioxide film according to a MOCVD method.

5. The method of manufacturing a semiconductor device according to claim 1, wherein:
    the silicon dioxide film as a part of the gate dielectric film is formed by oxidizing the semiconductor substrate using thermal oxidation, radical oxidation, plasma oxidation, or chemical oxidation.

6. The method of manufacturing a semiconductor device according to claim 1, wherein:
    the HfSiO film is formed according to a chemical vapor deposition which uses at least tetrakis-dimethyl-amino-silicon and tetrakis-diethyl-amino-hafnium.

7. The method of manufacturing a semiconductor device according to claim 1, the method further comprising:
    before forming the trench,
    forming a dummy gate in a region of the semiconductor substrate in which the gate electrode is formed;
    introducing impurity into the semiconductor substrate by using the dummy gate as a mask to form an extension layer;
    depositing a material of a sidewall protection film made of the silicon nitride film on the semiconductor substrate so as to cover the dummy gate;
    anisotropically etching the material of the sidewall protection film to form the sidewall protection film on the side surface of the dummy gate;
    depositing the material of the interlayer dielectric film on the semiconductor substrate so as to cover the dummy gate and the sidewall protection film; and
    flattening the interlayer dielectric film to expose the upper surface of the dummy gate, wherein:
    the trench is formed by removing the dummy gate.

8. The method of manufacturing a semiconductor device according to claim 1, wherein:
    a temperature of the depositing process of the gate dielectric film is within a range of 200 degrees centigrade to 260 degrees centigrade.

* * * * *